(12) United States Patent
Zitzlsperger

(10) Patent No.: US 9,876,154 B2
(45) Date of Patent: Jan. 23, 2018

(54) OPTOELECTRONIC COMPONENT WITH ASYMMETRIC CARRIER ARMS

(71) Applicant: OSRAM Opto Semiconductors GmbH, Regensburg (DE)

(72) Inventor: Michael Zitzlsperger, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/105,539

(22) PCT Filed: Dec. 18, 2014

(86) PCT No.: PCT/EP2014/078370
§ 371 (c)(1),
(2) Date: Jun. 16, 2016

(87) PCT Pub. No.: WO2015/091735
PCT Pub. Date: Jun. 25, 2015

(65) Prior Publication Data
US 2016/0322551 A1  Nov. 3, 2016

(30) Foreign Application Priority Data
Dec. 19, 2013  (DE) .................. 10 2013 226 721

(51) Int. Cl.
*H01L 25/04* (2014.01)
*H01L 25/075* (2006.01)
(Continued)

(52) U.S. Cl.
CPC .............. *H01L 33/62* (2013.01); *F21S 2/005* (2013.01); *H01L 23/495* (2013.01);
(Continued)

(58) Field of Classification Search
CPC ......... H01L 2924/0002; H01L 2924/00; H01L 25/042; H01L 25/0753; H01L 31/02005;
(Continued)

(56) References Cited

U.S. PATENT DOCUMENTS 8,487,323 B2  7/2013  Köhler et al.
9,231,179 B2  1/2016  Litzlsperger
(Continued)

FOREIGN PATENT DOCUMENTS

DE  102007041136 A1  3/2009
DE  102011056708 A1  6/2013
(Continued)

*Primary Examiner* — Tom Thomas
*Assistant Examiner* — Benjamin Tzu-Hung Liu
(74) *Attorney, Agent, or Firm* — Slater Matsil, LLP

(57) ABSTRACT

An optoelectronic component includes a housing that includes a rectangular basic shape with four sides. The sides each merge into one another at a corner point. At least two carrier arms of two contact elements of a lead frame are guided to an edge of the housing. The two carrier arms are arranged on different sides of the housing. The two carrier arms are each at different spacings from the two corner points of the side on which the carrier arms are arranged. The spacings differ at least in the width of a carrier arm.

7 Claims, 3 Drawing Sheets

(51) Int. Cl.
  *H01L 31/02* (2006.01)
  *H01L 31/0232* (2014.01)
  *H01L 33/58* (2010.01)
  *H01L 33/62* (2010.01)
  *H01L 23/495* (2006.01)
  *F21S 2/00* (2016.01)

(52) U.S. Cl.
  CPC ........ *H01L 25/042* (2013.01); *H01L 25/0753* (2013.01); *H01L 31/02005* (2013.01); *H01L 31/02327* (2013.01); *H01L 33/58* (2013.01); *H01L 2924/0002* (2013.01)

(58) Field of Classification Search
  CPC ... H01L 31/02327; H01L 33/58; H01L 33/62; H01L 23/495; F21S 2/005
  See application file for complete search history.

(56) References Cited

U.S. PATENT DOCUMENTS

| | | |
|---|---|---|
| 2003/0067775 A1 | 4/2003 | Nagai et al. |
| 2005/0007780 A1 | 1/2005 | Feuerborn et al. |
| 2007/0267637 A1 | 11/2007 | Kim et al. |
| 2011/0186880 A1* | 8/2011 | Kohler ..................... F21K 9/00 257/91 |

FOREIGN PATENT DOCUMENTS

| | | |
|---|---|---|
| DE | 102012101970 A1 | 9/2013 |
| EP | 1089335 A1 | 4/2001 |
| JP | 7115228 A | 5/1995 |

* cited by examiner

OPTOELECTRONIC COMPONENT WITH ASYMMETRIC CARRIER ARMS

This patent application is a national phase filing under section 371 of PCT/EP2014/078370, filed Dec. 18, 2014, which claims the priority of German patent application 10 2013 226 721.5, filed Dec. 19, 2013, each of which is incorporated herein by reference in its entirety.

TECHNICAL FIELD

The invention relates to an optoelectronic component with asymmetric carrier arms.

BACKGROUND

German patent publication DE 10 2012 101 970 A1 discloses a lead frame unit for an electronic component which has two contact carrier elements that are integrally formed with at least one holding web. The two contact carrier elements are connected to lead frame units by means of holding webs. In this case, the holding webs are arranged at least partly at the same distance from corner regions of the rectangular lead frame unit. Therefore, there is a risk of the carrier arms which protrude from the component coming into contact when a plurality of components are arranged next to one another. Therefore, it is necessary for a relatively large distance to be maintained between the components.

SUMMARY OF THE INVENTION

Embodiments of the invention provide an improved optoelectronic component and an improved lead frame for producing an optoelectronic component.

The component is formed in such a way that, at least on two sides of the housing, the carrier arms of a contact element are at different distances from the two corner points of the sides of the housing. The distances differ at least by a width of one carrier arm. In this way, it is possible for two components to be arranged next to one another in a manner rotated through 90°, 180° and/or 270°, without there being a risk of the carrier arms coming into contact. Therefore, the components can be mounted more closely next to one another on a carrier.

The two sides are arranged next to one another or opposite one another depending on the selected embodiment.

In a further embodiment, the component is formed in such a way that the carrier arms, on all four sides of the housing, are at different distances from the respective two corner points of the side on which the carrier arms are arranged. In this way, it is possible to arrange a component next to a further component, wherein the further component is rotated through 90°, wherein the carrier arms of the two components cannot come into contact with one another. In this way, it is possible to also arrange the components closely next to one another on a carrier in a manner rotated through 90°, without there being a risk of electrical contact between the carrier arms.

BRIEF DESCRIPTION OF THE DRAWINGS

The invention will be explained in greater detail below with reference to the figures.

The above-described properties, features and advantages of this invention and the way in which they are achieved will become clearer and more clearly understood in association with the following description of the exemplary embodiments which are explained in greater detail in association with the drawings, in which.

DETAILED DESCRIPTION OF ILLUSTRATIVE EMBODIMENTS

Figure 1:
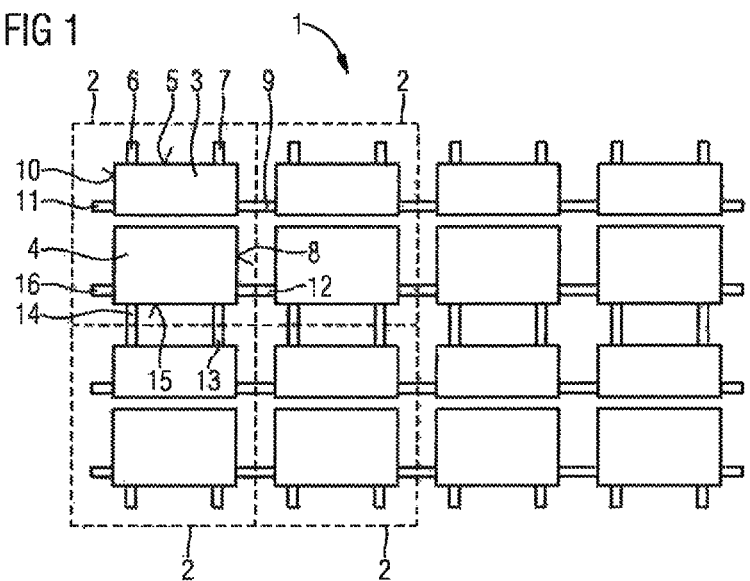
FIG. 1 shows a lead frame with contact elements.

FIG. 1 shows a schematic illustration of a lead frame 1 that has a plurality of lead frame units 2. The lead frame units 2 are of identical design. Each lead frame unit 2 has a first contact element 3 and a second contact element 4. In the illustrated exemplary embodiment, the first contact element 3 has a first and a second carrier arm 6, 7 on a first side 5. The first and the second carrier arm 6, 7 are connected to an opposite second contact element which is not illustrated in the illustrated figure. In addition, the first contact element 3 has a third carrier arm 9 on a second side 8. The third carrier arm 9 is connected to a further first contact element 3 of a further lead frame unit 2. In addition, the first contact element 3 has a fourth carrier arm 11 on a fourth side 10. The fourth carrier arm 11 is connected to a further first contact element, not illustrated, of a further lead frame unit.

The lead frame unit 2 has the second contact element 4 which is formed separately from the first contact element 3. The second contact element 4 has a fifth carrier arm 12 on the second side 8. The fifth carrier arm 12 is connected to a further second contact element of a further lead frame unit 2. In addition, the second contact element 4 has a sixth and a seventh carrier arm 13, 14. The sixth and the seventh carrier arm 13, 14 are formed on a third side 15. The sixth and the seventh carrier arm are connected to a first contact element 3 of a further lead frame unit 2. In addition, the second contact element 4 has an eighth carrier arm 16 which is formed on the fourth side 10. The first and the third side are arranged opposite one another. The second and the fourth side are arranged opposite one another.

Figure 2:
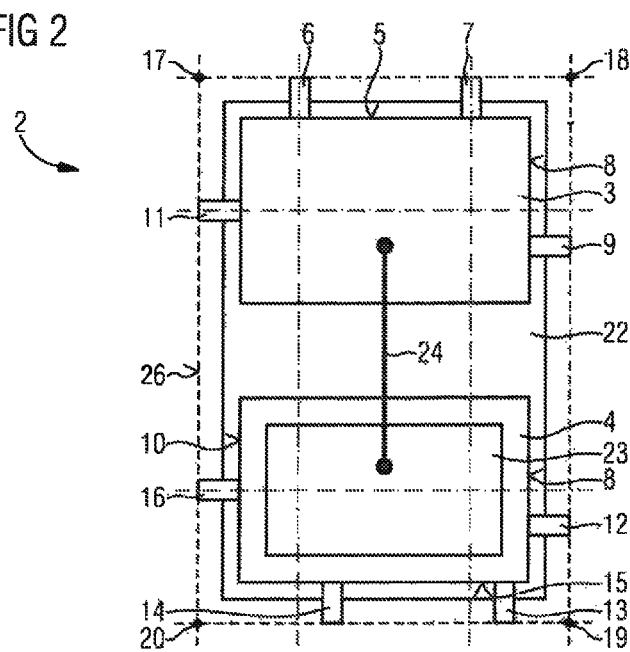
FIG. 2 shows a first component.

FIG. 2 shows an enlarged illustration of the lead frame unit 2. The lead frame unit 2 substantially has a rectangular basic shape 26. The basic shape 26 is indicated with the aid of dashed lines. The basic shape 26 has four corner points 17, 18, 19, 20. With reference to the figure, it can be clearly seen that the first and the second carrier arm 6, 7 are arranged at different distances in relation to the first and the second corner point 17, 18 in comparison to the sixth and the seventh carrier arm 13, 14 with corresponding different distances from the third and the fourth corner point 19, 20. The distances differ at least by a width of one carrier arm, so that the carrier arms do not come into contact when two identical components are arranged next to one another. During arrangement, at least one side of the components is arranged in a line. In this way, it is possible for two identical components to be arranged next to one another, wherein the first component can be arranged, by way of the first side 5, on the third side 15 of the second component, without the first and the second carrier arm 6, 7 of the first component coming into contact with the sixth or the seventh carrier arm 13, 14 of the second component. Therefore, the two components can be arranged at a closer distance to one another.

The third and the fifth carrier arm 9, 11 are likewise arranged at different distances from the second and, respectively, the third corner point 18, 19 in comparison to the fourth and the eighth carrier arm 11, 16 in relation to the fourth and, respectively, the first corner point 20, 17. In this way, two identical components can be arranged next to one another, wherein the first component is placed, by way of the second side 8, against the fourth side 10 of the second component in a manner rotated through 180°, without the carrier arms of the two components coming into contact with one another.

Depending on the selected embodiment, it is also possible for only the carrier arms of opposite sides of the lead frame unit 2 to be arranged at different distances from the corner points. In this embodiment, it is possible to arrange two identical components against one another in a manner rotated through 180°, without the carrier arms of the two components coming into contact.

In the embodiment illustrated in FIG. 2, two components can also be placed against one another in a manner rotated through 90°, without the carrier arms of the two components coming into contact.

The lead frame unit 2 is encapsulated in a housing 22 which has the same rectangular shape. The carrier arms terminate laterally flush with the housing 22 or can also protrude laterally beyond the housing 22. The housing 22 is produced, for example, from plastic. In addition, an optoelectronic component 23 is arranged on the second contact element 4, said optoelectronic component being connected to the first contact element 3 by means of an electrically conductive connection 24. The optoelectronic component 23 can be designed, for example, in the form of an LED, a laser diode, as a photodetector, as a phototransistor or as a photodiode.

Figure 3:
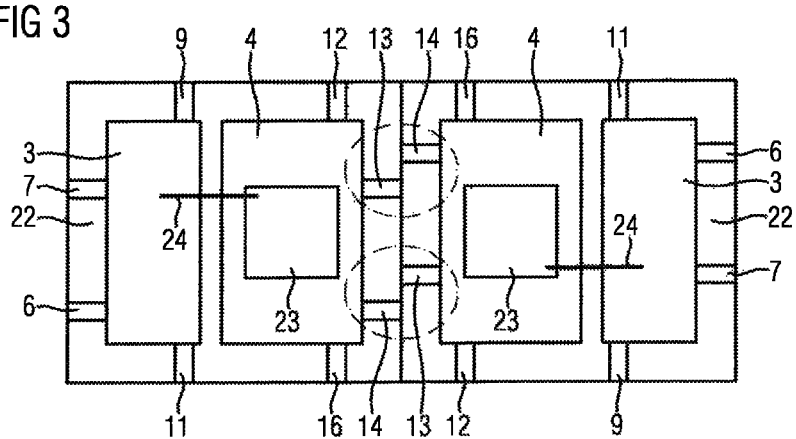
FIG. 3 shows a first arrangement of two components.

FIG. 3 shows a schematic illustration of 2 housings 22 according to FIG. 2 of identical design, which housings are each arranged in a manner rotated through 180° and are situated next to one another. It can be clearly seen in said figure that the carrier arms of the different housings do not come into contact. This is achieved by the carrier arms of the opposite sides not being arranged symmetrically in relation to the corner points.

Figure 4:
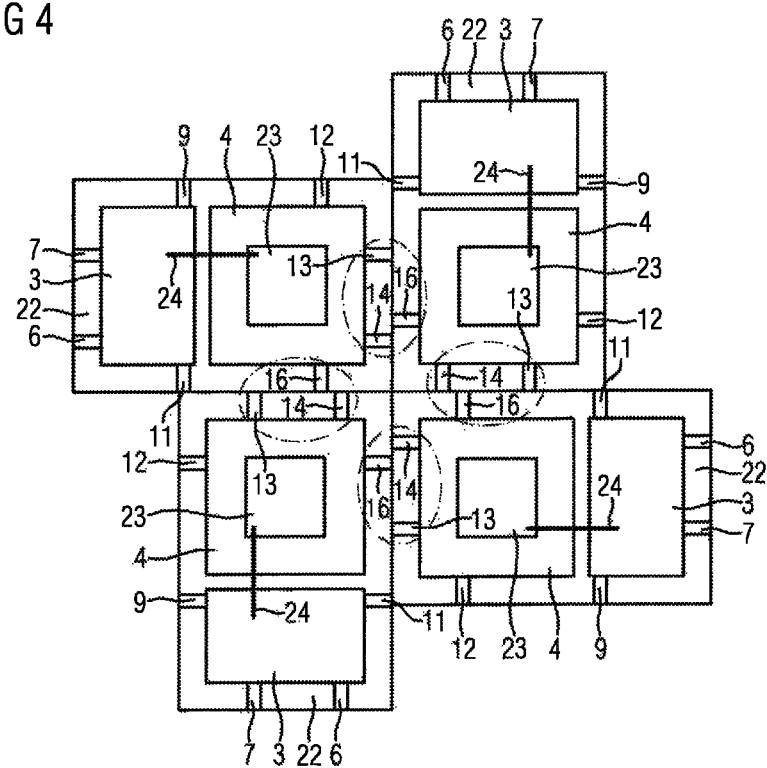
FIG. 4 shows a second arrangement of four components in the form of a clover leaf.

FIG. 4 shows a further embodiment in which four identical housings 22 according to FIG. 2 are arranged such that they adjoin one another in a clover leaf arrangement. The carrier arms of the four housings do not come into contact with one another in this embodiment either. This is achieved by the carrier arms being at different distances from the respectively closest corner point.

Figure 5:
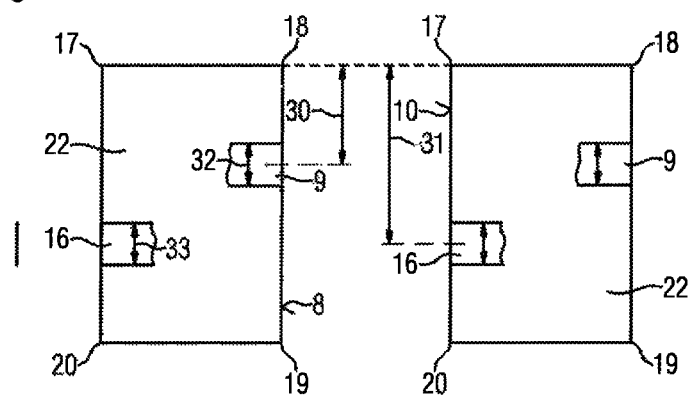
FIGS. 5 and 6 show further arrangements of two identical components.

FIG. 5 shows a further arrangement of two identical optoelectronic components 22 which are formed, for example, according to FIG. 2 and are arranged next to one another. Only the third and the eighth carrier arm 9, 16 are illustrated in FIG. 5. In said figure, a second side 8 of a component 22 is associated with a fourth side 10 of the adjacent component 22. Since the distances 30, 31 of the third carrier arm 9 and of the eighth carrier arm 16 from the corner points 18, 17 differ by at least a width 32, 33 of the widest carrier arm 9, 16, the third and the eighth carrier arm 9, 16 do not come into contact. The carrier arms generally have the same width, that is to say they have the same extent parallel to the side of the component 22.

The components 22 of FIG. 5 can also have more or fewer carrier arms than the embodiment illustrated in FIG. 2.

Figure 6:
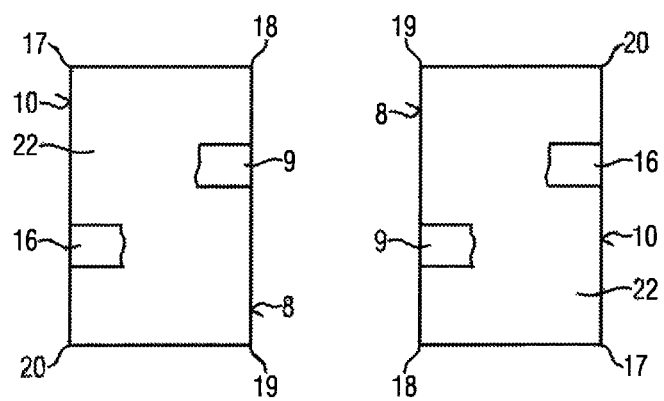

FIG. 6 shows a further arrangement of two identical optoelectronic components 22 which are formed, for example, according to FIG. 2 and are arranged in a manner rotated through 180° in relation to one another. In said figure, a second side 8 of a component 22 is associated with a second side 8 of the adjacent component 22. Only the third and the eighth carrier arm 9, 16 are illustrated in FIG. 6. Since the distances 30, 31 of the third carrier arms 9 from the corner points 18, 17 differ by at least a width 32, 33 of the carrier arm 9 and the two second sides 8 of the components 22 are of equal length, the third carrier arms 9 of the two components 22 do not come into contact. The components 22 of FIG. 6 can also have more or fewer carrier arms than the embodiment illustrated in FIG. 2.

Although the invention has been more specifically illustrated and described in detail by means of the preferred exemplary embodiment, nevertheless the invention is not restricted by the examples disclosed and other variations can be derived therefrom by the person skilled in the art, without departing from the scope of protection of the invention.

The invention claimed is:

1. An arrangement comprising:
    an optoelectronic component comprising:
        a housing which has a rectangular basic shape with four sides and four corner points, wherein each side merges with two adjacent sides at a respective two of the corner points;
        a lead frame that includes first and second contact elements, wherein a plurality of carrier arms of the first and second contact elements are guided up to an edge of the housing, wherein a first carrier arm and a second carrier arm are formed on a first side and an opposite further side of the housing, wherein the first and second carrier arms are each at different distances from the corner points of the side on which the carrier arms are arranged, and wherein the distances differ at least by a width of one carrier arm; and
        an optical element arranged on the second contact element;
    a second optoelectronic component that is of substantially the same design as the optoelectronic component;
    a third optoelectronic component that is of substantially the same design as the optoelectronic component;
    a fourth optoelectronic component that is of substantially the same design as the optoelectronic component;
    wherein the four sides of each optoelectronic component include a first side, a second side, a third side and a fourth side, the first side being arranged opposite the third side and the second side being arranged opposite the fourth side;
    wherein the optoelectronic component, the second optoelectronic component, the third optoelectronic component, and the fourth optoelectronic component are arranged in a clover leaf arrangement, so that the optoelectronic components adjoin one another by way of the corner point that is arranged between the first and the second side;
    wherein a first side of each optoelectronic component adjoins a second side of a further component;
    wherein a second side of each optoelectronic component bears against a first side of another further component; and
    wherein the carrier arms of the sides of the optoelectronic components which bear one against the other do not come into contact.

2. The arrangement according to claim 1, wherein each optical component further comprises an optical element electrically connected to the first and second contact elements of the optical component.

3. A lead frame comprising:
a plurality of lead frame units that each include first and second contact elements that are provided for making electrical contact with an LED;
wherein, for each lead frame unit, the first and second contact elements define a rectangular shape of a housing of the LED;
wherein, for each lead frame unit, the rectangular shape of the housing has four sides and four corner points, each side merging with two adjacent sides at a respective two of the corner points;
wherein, for each lead frame unit, the first contact element is connected to a first part of the lead frame by a first carrier arm;
wherein, for each lead frame unit, the second contact element is connected to a second part of the lead frame by a second carrier arm;
wherein, for each lead frame unit, the first and second carrier arms protrude on opposite sides of the rectangular shape;
wherein, for each lead frame unit, the first and second carrier arms are each at different distances from the two corner points of the side on which the carrier arms are arranged;
wherein the lead frame units are connected to one another by the carrier arms;
wherein, for each lead frame unit, the first contact element has a first and a second carrier arm on a first side;
wherein, for each lead frame unit, the first and the second carrier arm are connected to an opposite second contact element of a lead frame unit;
wherein, for each lead frame unit, the first contact element has a third carrier arm on a second side;
wherein, for each lead frame unit, the third carrier arm is connected to a further first contact element of a further lead frame unit;
wherein, for each lead frame unit, the first contact element has a fourth carrier arm on a fourth side;
wherein, for each lead frame unit, the fourth carrier arm is connected to a further first contact element of a further lead frame unit;
wherein, for each lead frame unit, the second contact element is formed separately from the first contact element;
wherein, for each lead frame unit, the second contact element has a fifth carrier arm on the second side;
wherein, for each lead frame unit, the fifth carrier arm is connected to a further second contact element of a further lead frame unit;
wherein, for each lead frame unit, the second contact element has a sixth and a seventh carrier arm;
wherein, for each lead frame unit, the sixth and the seventh carrier arm are formed on a third side;
wherein, for each lead frame unit, the sixth and the seventh carrier arm are connected to a first contact element of a further lead frame unit;
wherein, for each lead frame unit, the second contact element has an eighth carrier arm which is formed on the fourth side;
wherein, for each lead frame unit, the first and the third side are arranged opposite one another; and
wherein, for each lead frame unit, the second and the fourth side are arranged opposite one another.
4. The lead frame according to claim 3, wherein the lead frame units are of identical design and wherein the lead frame units are connected to one another by the carrier arms.

5. An optoelectronic component comprising:
a housing which has a rectangular basic shape with four sides and four corner points, wherein each side merges with two adjacent sides at a respective two of the corner points; and
a lead frame that includes first and second contact elements, wherein a plurality of carrier arms of the first and second contact elements are guided up to an edge of the housing, wherein a first carrier arm and a second carrier arm are formed on a first side and an opposite further side of the housing, wherein the first and second carrier arms are each at different distances from the corner points of the side on which the carrier arms are arranged, and wherein the distances differ at least by a width of one carrier arm;
wherein the first contact element has a first and a second carrier arm on the first side;
wherein the first contact element has a third carrier arm on a second side;
wherein the first contact element has a fourth carrier arm on a fourth side;
wherein the second side and the fourth side are arranged opposite one another;
wherein the second contact element is formed separately from the first contact element;
wherein the second contact element has a fifth carrier arm on the second side;
wherein the second contact element has a sixth and a seventh carrier arm on a third side;
wherein the first side and the third side are arranged opposite one another;
wherein the second contact element has an eighth carrier arm that is arranged on the fourth side;
wherein the first and the second contact element constitute a lead frame unit with a substantially rectangular basic shape that has four corner points;
wherein the first carrier arm and the second carrier arm are arranged at different distances in relation to a first and a second corner point in comparison to the sixth and the seventh carrier arm with corresponding different distances from a third and a fourth corner point;
wherein the distances differ at least by a width of one carrier arm; and
wherein the third and the fifth carrier arm are arranged at different distances from the second and, respectively, the third corner point in comparison to the fourth and the eighth carrier arm in relation to the fourth and, respectively, the first corner point.
6. An optoelectronic component comprising:
a housing which has a rectangular basic shape with four sides and four corner points, wherein each side merges with two adjacent sides at a respective two of the corner points; and
a lead frame that includes first and second contact elements, wherein a plurality of carrier arms of the first and second contact elements are guided up to an edge of the housing, wherein a first carrier arm and a second carrier arm are formed on a first side and an opposite further side of the housing, wherein the first and second carrier arms are each at different distances from the corner points of the side on which the carrier arms are arranged, and wherein the distances differ at least by a width of one carrier arm;
a second optoelectronic component that is of substantially the same design as the optoelectronic component;
wherein the four sides of each optoelectronic component include a first side, a second side, a third side and a fourth side, the first side being arranged opposite the third side and the second side being arranged opposite the fourth side;

wherein a first side the optoelectronic component bears against a third side of the second optoelectronic component;

wherein the corner points of the first side of the optoelectronic component and the corner points of the third side of the second optoelectronic component adjoin one another; and wherein the carrier arms of the first side of the optoelectronic component are arranged in a manner laterally offset with respect to the carrier arms of the third side of the second optoelectronic component and do not come into contact.

7. The optoelectronic component according to claim 6, wherein each optical component further comprises an optical element electrically connected to the first and second contact elements of the optical component.

* * * * *